(12) United States Patent
Ding et al.

(10) Patent No.: US 8,589,832 B2
(45) Date of Patent: *Nov. 19, 2013

(54) ON CHIP SHIELDING STRUCTURE FOR INTEGRATED CIRCUITS OR DEVICES ON A SUBSTRATE AND METHOD OF SHIELDING

(75) Inventors: Hanyi Ding, Essex Junction, VT (US); Kai D. Feng, Hopewell Junction, NY (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 1001 days.

This patent is subject to a terminal disclaimer.

(21) Appl. No.: 11/844,397

(22) Filed: Aug. 24, 2007

(65) Prior Publication Data

US 2009/0052153 A1 Feb. 26, 2009

(51) Int. Cl.
*G06F 17/50* (2006.01)

(52) U.S. Cl.
USPC .......................................................... 716/100

(58) Field of Classification Search
USPC ............... 716/1, 100–102; 361/683, 816–818
See application file for complete search history.

(56) References Cited

U.S. PATENT DOCUMENTS

| | | | |
|---|---|---|---|
| 4,796,084 A | 1/1989 | Kamasaki et al. | |
| 5,060,659 A | 10/1991 | Cook et al. | |
| 5,151,769 A | 9/1992 | Immorlica, Jr. et al. | |
| 5,811,882 A | 9/1998 | Latham, IV et al. | |
| 6,307,252 B1 | 10/2001 | Knoedl, Jr. | |
| 6,432,754 B1 * | 8/2002 | Assaderaghi et al. | 438/149 |
| 6,998,712 B2 | 2/2006 | Okada et al. | |
| 7,119,420 B2 | 10/2006 | Tzu | |
| 7,681,152 B2 | 3/2010 | Short et al. | |
| 2002/0130916 A1 * | 9/2002 | Gulvin et al. | 347/20 |
| 2002/0148979 A1 * | 10/2002 | Featherby et al. | 250/515.1 |
| 2003/0025180 A1 | 2/2003 | Alcoe et al. | |
| 2006/0096773 A1 * | 5/2006 | Cochrance | 174/35 R |
| 2006/0180916 A1 | 8/2006 | Wyland | |
| 2006/0192265 A1 | 8/2006 | Hsu | |
| 2006/0237823 A1 | 10/2006 | Spielberger et al. | |
| 2006/0272857 A1 * | 12/2006 | Arnold | 174/377 |
| 2007/0298526 A1 | 12/2007 | Berry et al. | |
| 2008/0158851 A1 * | 7/2008 | Cochrane | 361/818 |
| 2008/0282212 A1 | 11/2008 | Dennison et al. | |
| 2009/0052153 A1 | 2/2009 | Ding et al. | |
| 2009/0055790 A1 * | 2/2009 | Ding et al. | 716/11 |

FOREIGN PATENT DOCUMENTS

JP  03-155653  7/1991

OTHER PUBLICATIONS

Final Office Action dated Mar. 3, 2011 in U.S. Appl. No. 12/046,750.
Office Action dated Sep. 17, 2010 in U.S. Appl. No. 12/046,750.
Office Action dated Mar. 2, 2012 in U.S. Appl. No. 12/046,750.

(Continued)

*Primary Examiner* — Binh Tat
(74) *Attorney, Agent, or Firm* — Anthony Canale; Roberts Mlotkowski Safran & Cole, P.C.

(57) ABSTRACT

An electromagnetic shielding structure that includes a conductive structure surrounding and accommodating a circuit or a circuit device arranged on a substrate. At least one feed through device is associated with the conductive structure and provides signals to the circuit or circuit device. The method includes forming a shielding structure so that the shielding structure at least one of is at least partially arranged within the substrate and surrounds the circuit or circuit device and associating at least one feed through device with the shielding structure.

20 Claims, 12 Drawing Sheets

(56) References Cited

OTHER PUBLICATIONS

Office Action dated Sep. 12, 2012, for U.S. Appl. No. 12/046,750; 25 pages.

Office Action dated Mar. 22, 2013, for U.S. Appl. No. 12/046,750; 30 pages.

Notice of Allowance dated Jun. 14, 2013, for U.S. Appl. No. 12/046,750; 13 pages.

* cited by examiner

ON CHIP SHIELDING STRUCTURE FOR INTEGRATED CIRCUITS OR DEVICES ON A SUBSTRATE AND METHOD OF SHIELDING

BACKGROUND OF THE INVENTION

1. Field of the Invention

The invention relates to a circuit and method of manufacture, and more particularly, to electromagnetic on chip shielding of a circuit (e.g. plurality of devices) and/or one or more devices formed on a semiconductor substrate, and a method of shielding devices and/or a circuit.

2. Background Description

In an attempt to solve RF interference problems, shielding structures in the metal level of a substrate have been utilized, but typically without a high doping layer in the substrate. Such structures also typically do not protect the devices in the substrate. They also lack feed through connection interface devices without degrading the shielding effectiveness such as feed through capacitors for the supply of power connections and DC signal connections, and/or transmission lines for the AC signal connections.

In high frequency, wide bandwidth and high gain applications, radiation shielding is becoming more and more necessary. This is particularly true in, e.g., cellular systems, which are very popular and which have to cope with lots of radiation signals in the air. Such signals can enter a cellular transceiver chip as unwanted signals and disturb the cellular phone operation. The path of an unwanted signal can enter the system either by direct radiation and/or by a metal connection, such as power connections. Furthermore, current system level shielding is expensive and incomplete due to many holes, e.g., holes for display and operation buttons, which exist in the shielding. In millimeter wave applications, the wavelength is approaching the connection length inside of a die and the radiation interference in a chip is getting stronger and stronger.

The protection of circuits sensitive to magnetic fields has also been utilized. One such method uses passivation of silicon dioxide or silicon nitride, i.e., isolated materials. However, these materials cannot be used to shield RF interference. Another method provides for dispersing of a shielding material powder. However, this is not usable as a high doping layer in a substrate.

The shielding of modules (package level) is also known. However, this shielding is not typically used in chip shielding and does not utilize feed through capacitors and/or transmission lines.

It is also known to construct an electromagnetic interference shield in a package assembling process. However, such shielding is not utilized for on-chip shielding and does not utilize transmission lines and/or feed through capacitors to minimize the possible leakage through connection openings.

A seal ring has been used to surround an LSI circuit to prevent dicing and bonding crack, and to improve moisture resistance. Such arrangements can use metal wiring and doping in silicon for the seal ring. However, such arrangements are not typically utilized for electromagnetic shielding. Furthermore, they typically lack a bottom conductive layer and a top wiring layer, and do not form a full box.

Packaging EMI has also been utilized, but not for chip shielding. Such packaging also does not utilize feed through capacitors or transmission lines, and does not form a complete shielding structure.

Accordingly, there exists a need in the art to overcome the deficiencies and limitations described hereinabove.

SUMMARY OF THE INVENTION

In a first aspect of the invention, an electromagnetic shielding structure is provided that comprises a conductive structure surrounding and accommodating a circuit or a circuit device arranged on a substrate and at least one feed through capacitor and one transmission line associated with the conductive structure and providing the power supply and signals to the circuit or circuit device respectively.

In a second aspect of the invention, an electromagnetic shielding structure is provided that comprises a shielding structure surrounding a circuit or a circuit device arranged on a substrate and at least one feed through capacitor or a transmission line arranged on a side of the shielding structure.

In a third aspect of the invention, a method of electromagnetic shielding a circuit or circuit device arranged on or in a substrate comprises forming a shielding structure so that the shielding structure at least one of is at least partially arranged within the substrate and surrounds the circuit or circuit device, and providing at least one feed through capacitor and transmission lines with the shielding structure.

DETAILED DESCRIPTION OF EMBODIMENTS OF THE INVENTION

The invention relates to a circuit and method of manufacture, and more particularly, to electromagnetic shielding of a circuit (e.g. plurality of devices) and/or one or more devices formed on a semiconductor substrate, and a method of shielding devices and/or a circuit.

The invention relates to electromagnetic shielding of a circuit (e.g. plurality of devices) and/or one or more devices formed on a semiconductor substrate, and a method of shielding devices and/or a circuit. The shielding has the form of a conductive structure surrounding and accommodating the circuit (or devices).

The invention relates to electromagnetic shielding of a circuit (e.g. plurality of devices) formed on a semiconductor substrate. The shielding forms a conductive structure surrounding and accommodating the circuit (or devices). The invention also relates to a method of shielding devices and/or circuits.

According to an embodiment of the invention, devices are formed in a silicon substrate and a conductive shielding structure, having the form of a three-dimensional (3D) structure (e.g. box), surrounding the devices. The box has a bottom that can be formed by doping regions in the substrate, sidewalls that can be formed by doping regions or forming vias in the substrate, and, in particular, via bars, and a top that can be in the form of an interconnect layer, e.g., a metal layer. The conductive shielding structure can thus include portions which comprise metal, doped semiconductor regions, or the like.

According to another embodiment, a shielding structure is utilized to surround a chip device and has the form of a six side structure or box that utilizes, among other things, a conductive high doping bottom layer, sides formed in the substrate, and either a feed through capacitor (supplying DC signals) or a transmission line (supplying AC signals) arranged on one of the sides of the box structure.

Figure 1:
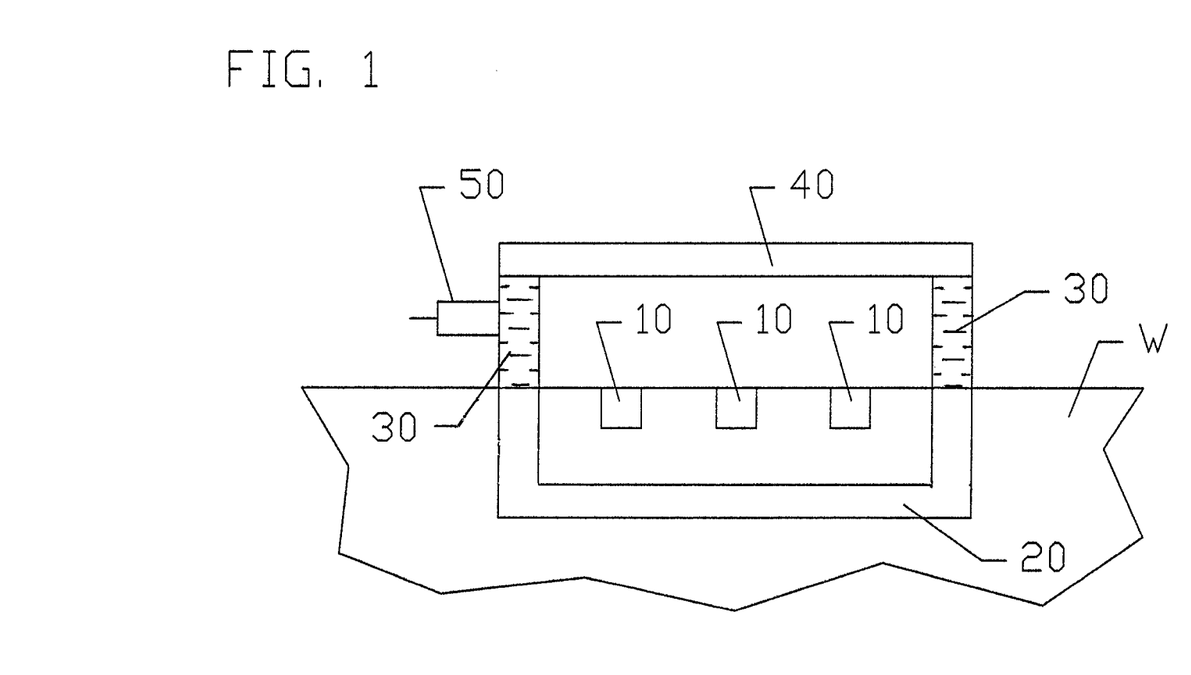
FIG. 1 shows a side view of a shielding box completely surrounding and shielding a circuit made of devices arranged on a wafer in accordance with the invention.

FIG. 1 shows one embodiment of a shielding box utilizing a high or top level metal cover 40, a bottom 20 having the form of a high doping layer with high conductivity, and side walls 30 having the form of contacts/vias and metal layers. By way of example, the cover 40 can be copper having a thickness of about 4 μm, the bottom layer 20 can be a high doping layer having a thickness of about 2 μm, and the side walls 30 can have the form of conductive via and/or contact bars, metal layers, and highly doped silicon layers.

One or more feed through devices 50 are associated with the shielding box. The device(s) 50 is arranged on one of the sides such as on one of the via sidewalls 30. The feed through device 50 functions to provide power to one or more devices 10 arranged on a wafer W. The advantage of the feed through device 50 is that it can be designed with different cut off frequencies for different types of signals. By way of example, the devices 10 can be part of a circuit or can be circuit devices, and can be, in particular, a low noise amplifier. The device 50 can, in particular, supply input and output signals (DC or AC) to and from the devices 10 and into and out of the shielding box. When the devices 10 are digital devices or devices utilizing DC signals, the feed through device 50 can be a feed through capacitor or DC feed through device.

Figure 2:
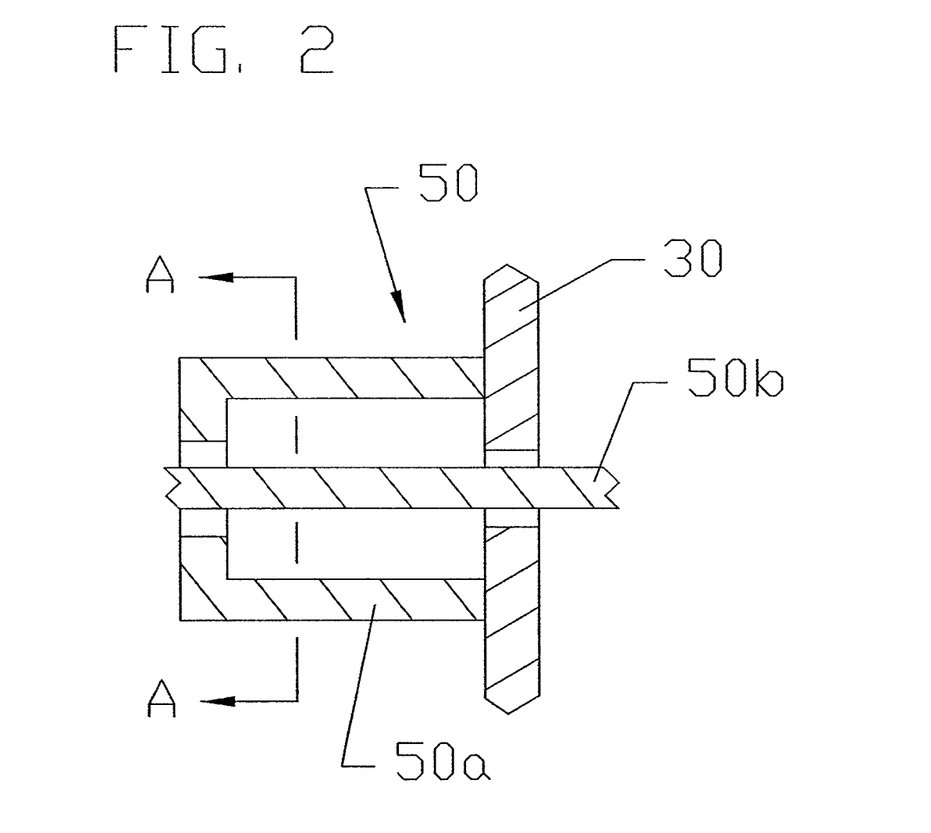
FIG. 2 shows an enlarged cross-section view of a DC power supply connection which can be used on the box of FIG. 1, and which has the form of a feed through capacitor.
Figure 3:
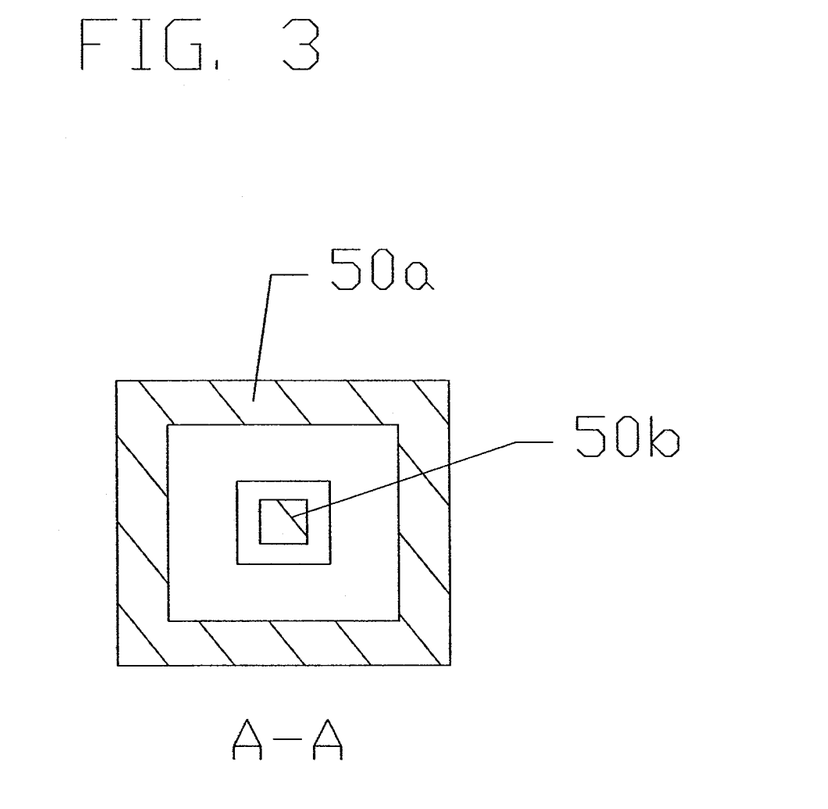
FIG. 3 shows a section A-A view of FIG. 2.

FIGS. 2 and 3 show a feed through capacitor 50 arranged on a sidewall 30 of the shielding box. The feed through capacitor 50 has an outer member 50a and an inner member 50b. The outer member 50a has one end coupled to the sidewall 30 and another end surrounding the inner member 50b. The inner member 50b passes through the outer member 50a and the sidewall 30.

When the devices 10 are high frequency devices, devices utilizing AC signals, or devices utilizing controlled impedance transmission lines, the feed through device can be an AC feed through device which has a required line inductance to capacitance ratio for the given characteristic impedance.

Figure 4:
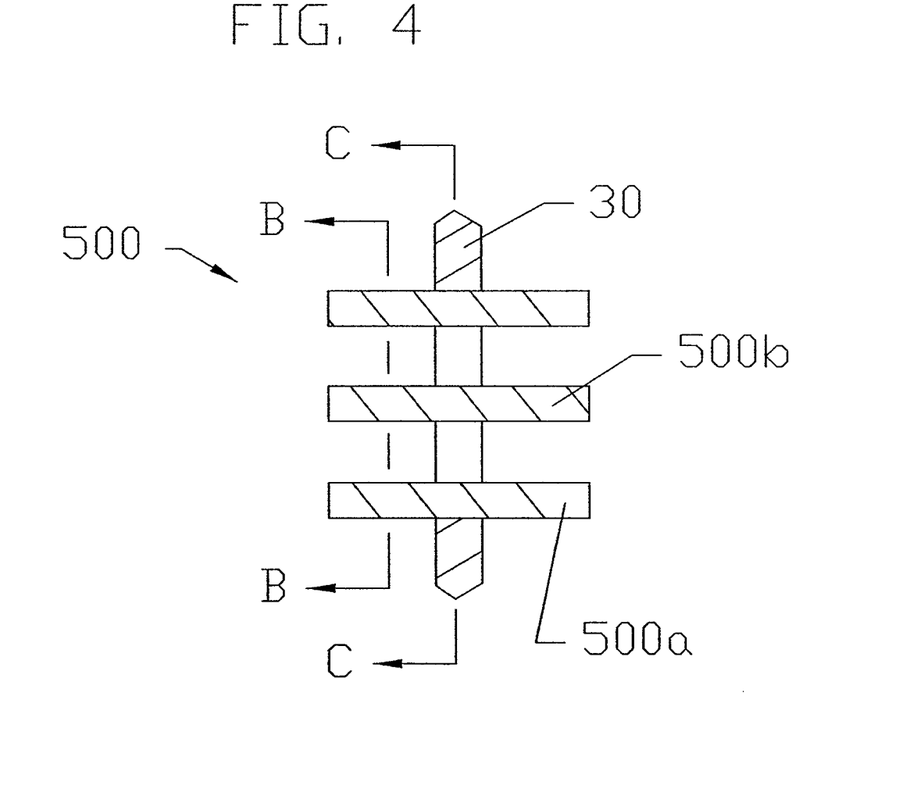
FIG. 4 shows an enlarged cross-section view of an AC signal path which can be used on the box of FIG. 1, and which can have the form of a feed through stripline.
Figure 5:
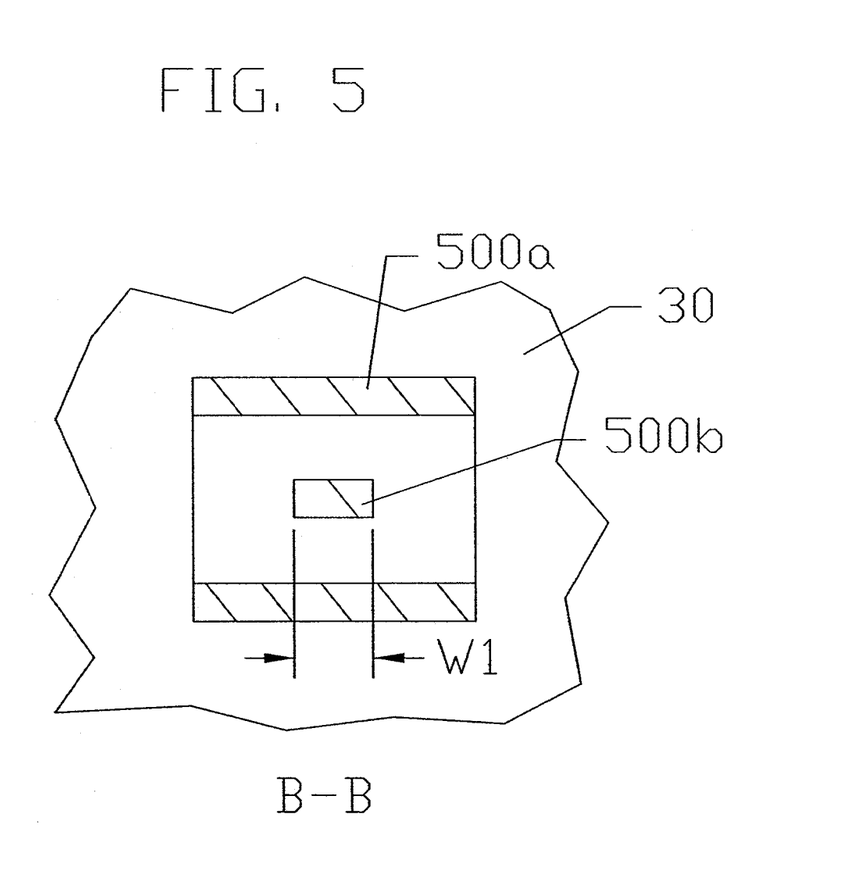
FIG. 5 shows a section B-B view of FIG. 4.
Figure 6:
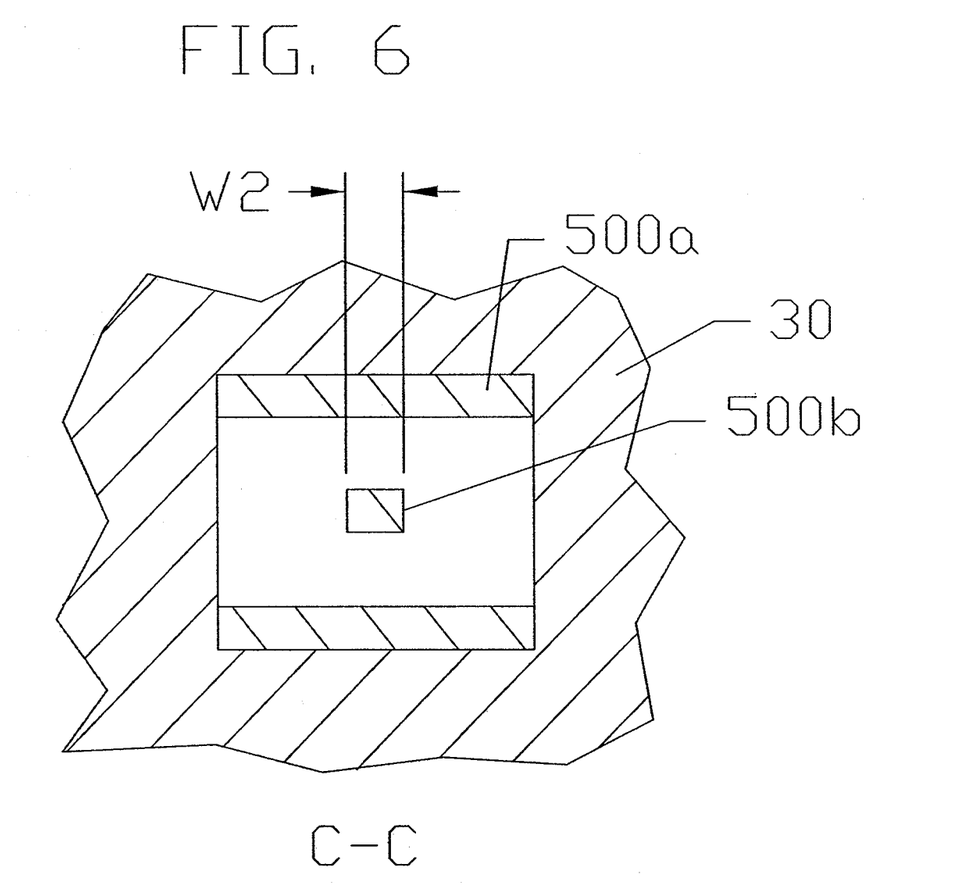
FIG. 6 shows a section C-C view of FIG. 4.

FIGS. 4-6 show such an AC feed through device 500 in the form of a stripline. As is shown in FIG. 4, the feed through stripline 500 has one or more outer members 500a and an inner member 500b. The outer members 500a have one end extending out from one side of the sidewall 30 and another end extending out from an opposite side of the sidewall 30 and into the shielding box. The outer members 500a surround all or part of the inner member 500b. The inner member 500b passes within and through the outer member 500a and also through the sidewall 30.

FIGS. 4 and 5 show that the inner member 500b crossing the sidewall 30 of the shielding box and the outer member 500a have different line widths. The width W1 of member 500b through section B-B shown in FIG. 5 can be greater than the width W2 of member 500b through section C-C shown in FIG. 6 in order to compensate for the wall effect on the characterization impedance.

When the devices 10 are high frequency devices, devices utilizing AC signals, or devices utilizing controlled impedance transmission lines, the feed through device can alternatively be an AC feed through device which has a required line inductance to capacitance ratio for the given characteristic impedance.

Figure 7:
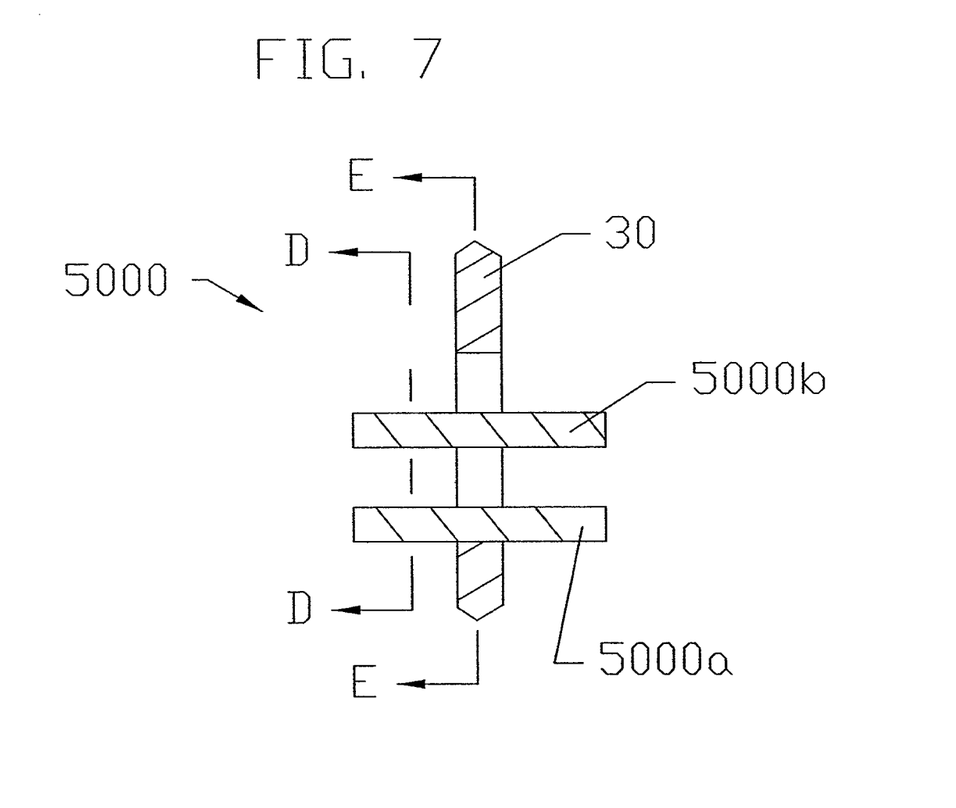
FIG. 7 shows an enlarged cross-section view of an AC signal path which can be used on the box of FIG. 1, and which can have the form of a feed through micro-stripline.
Figure 8:
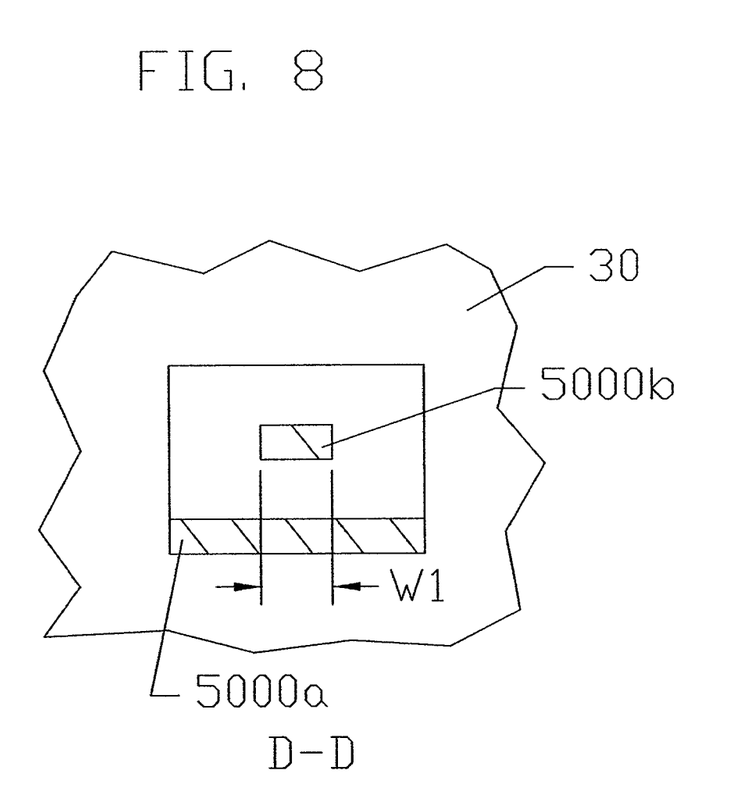
FIG. 8 shows a section D-D view of FIG. 7.
Figure 9:
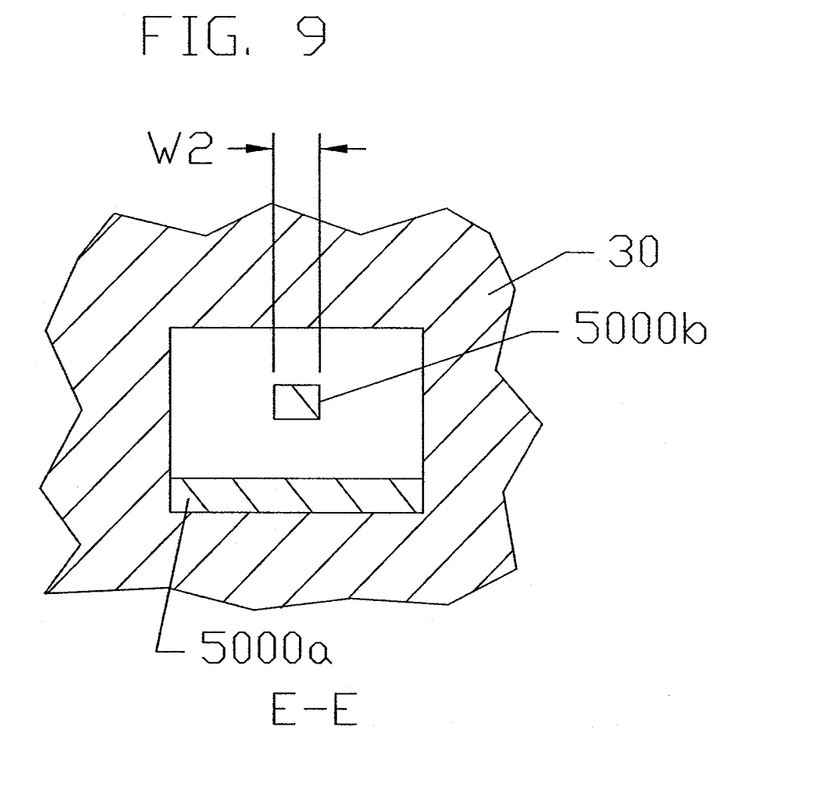
FIG. 9 shows a section E-E view of FIG. 7.

FIGS. 7-9 show an alternative AC feed through device 5000 in the form of a micro-stripline. As is shown in FIG. 7, the feed through micro-stripline 5000 has one outer member 5000a and an inner member 5000b. The outer member 5000a has one end extending out from one side of the sidewall 30 and another end extending out from an opposite side of the sidewall 30 and into the shielding box. The outer member 5000a surrounds part of the inner member 5000b. The inner member 5000b is spaced from the outer member 5000a and through the sidewall 30.

FIGS. 8 and 9 show that the inner member 5000b crossing the sidewall 30 of the shielding box and the outer member 5000a have different line widths. The width W1 of member 5000b through section D-C shown in FIG. 8 can be greater than the width W2 of member 5000b through section E-E shown in FIG. 9 in order to compensate for the wall effect on the characterization impedance.

Figure 10:
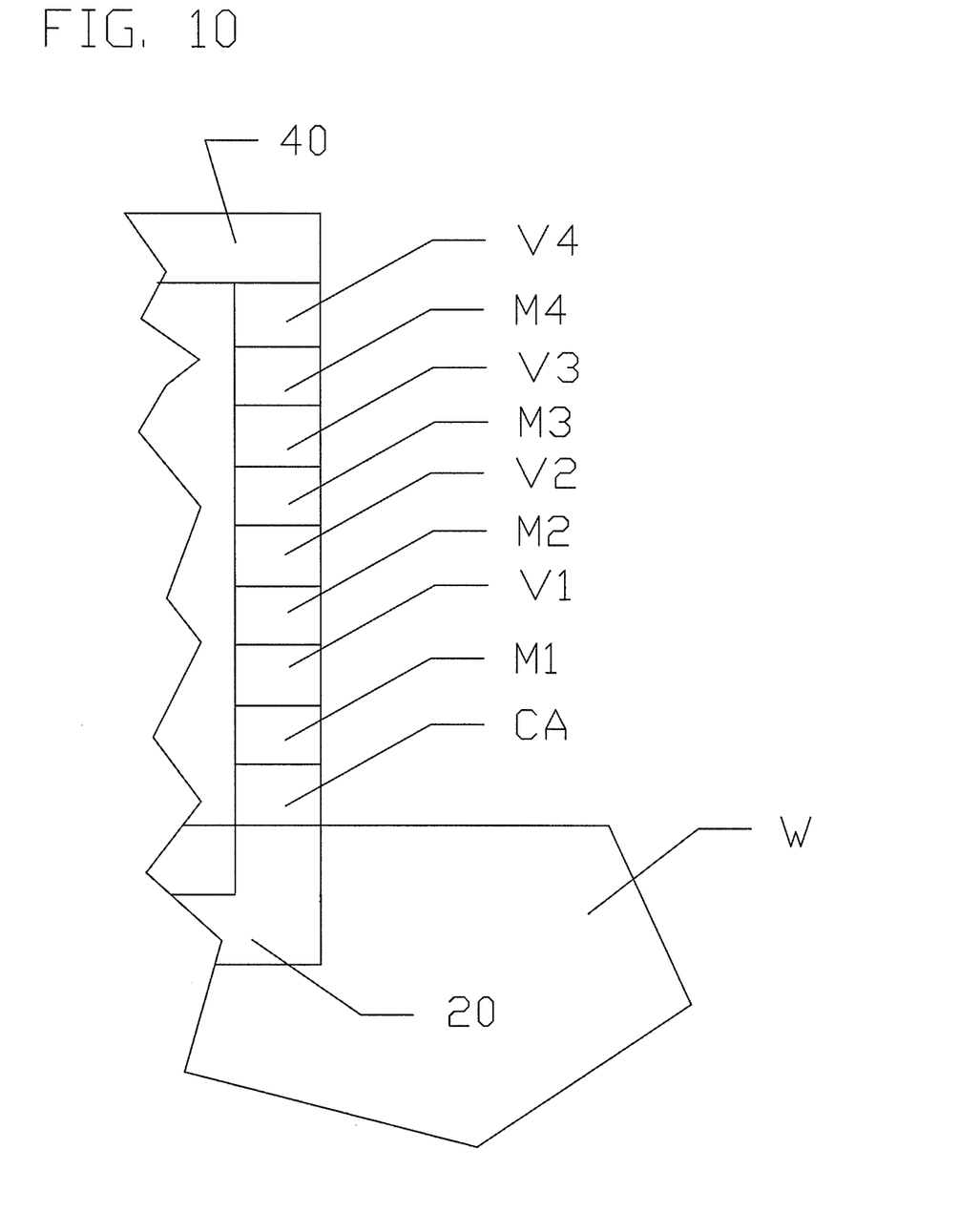
FIG. 10 shows an enlarged partial view of the box of FIG. 1 and illustrates the various layers which make up the via sidewalls of the shielding box.

FIG. 10 shows one non-limiting way in which the sidewall (s) 30 can be configured as a multi-layered structure. The via-metal sidewall 30 can have a first layer CA which extends between the bottom 20 and up to an area of M1 above the surface of the wafer W. A layer of CA extends from the high doping layer to M1, A layer V1 extends from layer M1 to layer M2, A layer V2 extends from layer M2 to layer M3. Layer V3 extends from layer M3 to layer M4, Finally, layer V4 extends from layer M4 to cover 40. By way of example, the layers CA, M1, V1, M2, V2, M3, V3, M4 and V4—can also be wiring levels which include, e.g., copper.

Figure 11:
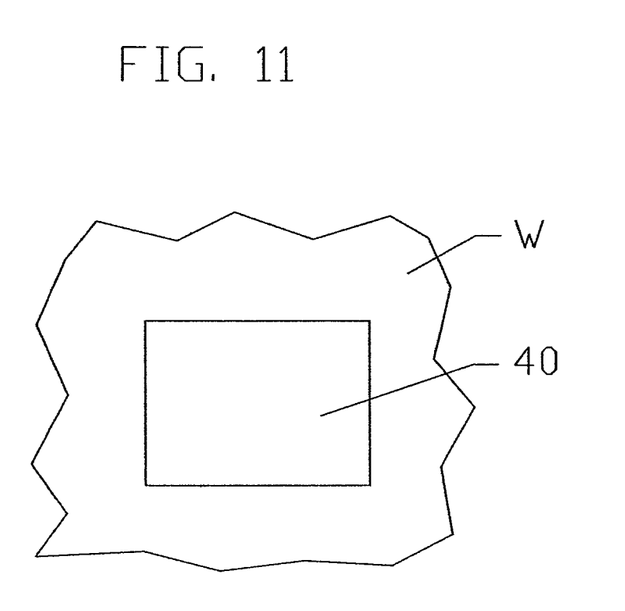
FIGS. 11-14 show top views of various optional shapes that can be utilized for the shielding box in accordance with the invention.

FIG. 11 shows a top view of one non-limiting shape for the shielding box arranged on a wafer W. As is apparent from the shape of the cover 40, the shielding box can be polygonal or rectangular.

Figure 12:
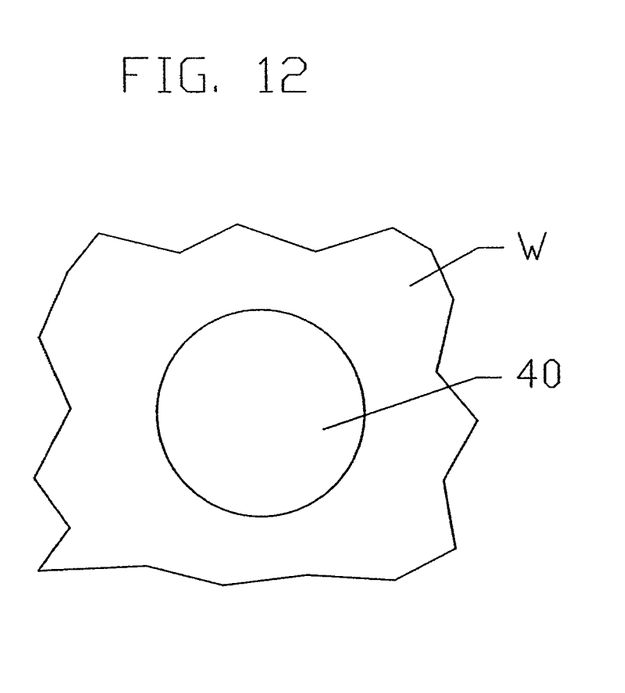

FIG. 12 shows a top view of another non-limiting shape for the shielding box arranged on a wafer W. As is apparent from the shape of the cover 40, the shielding box can be circular or round.

Figure 13:
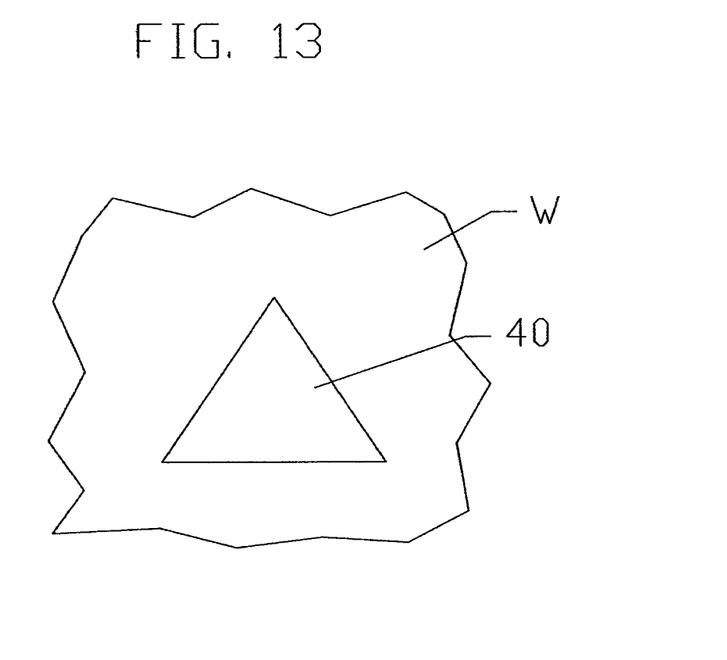

FIG. 13 shows a top view of another non-limiting shape for the shielding box arranged on a wafer W. As is apparent from the shape of the cover 40, the shielding box can be triangular or three-sided.

Figure 14:
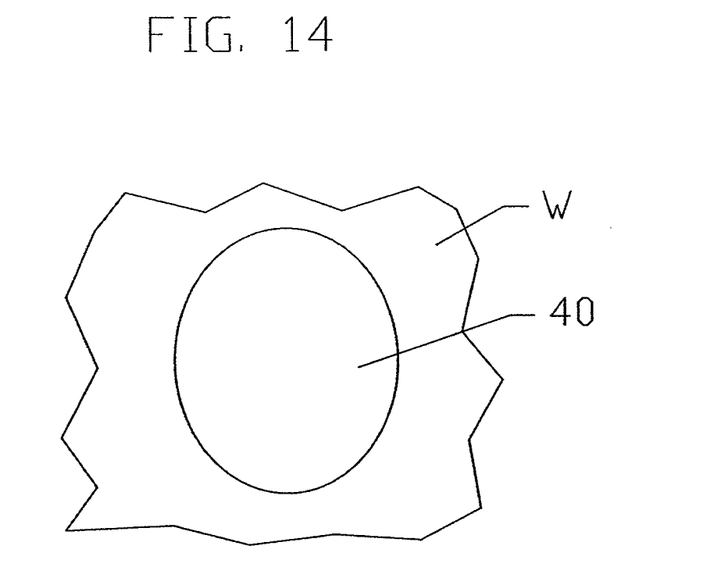

FIG. 14 shows a top view of another non-limiting shape for the shielding box arranged on a wafer W. As is apparent from the shape of the cover 40, the shielding box can be elliptical, oval or egg-shaped. Of course, other shaped are also contemplated.

With the shielding box according to the invention, simulations have shown that the isolation improvement can be significant. For example, over the frequency range of 1 to 110 GHz, the improvement can be from between about 2 dB to about 5 dB when spaced apart transmission lines are terminated at both ends and the lines have well defined return paths to between about 20 and about 30 dB (i) when spaced apart transmission lines have only outside ends terminated and the lines do not have well defined return paths, or (ii) when spaced apart transmission lines have both ends terminated and the lines do not have well defined return paths, or (iii) when spaced apart transmission lines have only outside end terminated and the lines do have well defined return paths.

The shielding box of the invention can thus improve the isolation significantly depending on the signal and noise line configurations. For example, when mismatched lines are used (i.e., one end terminated with 50 ohms, the other end having an open circuit), the isolation improvement can be 20 dB and higher no matter whether the lines (signal or noise) have well defined return path or not. Furthermore, even when load matching is utilized and there is a well defined return path, the isolation improvement can be from 2 to 5 dB. In design for the real world, however, it is very difficult to get a well defined return path and maintain perfect match. Accordingly, the shielding box can be very useful in reducing coupling between different circuit blocks.

While the invention has been described in terms of exemplary embodiments, those skilled in the art will recognize that the invention can be practiced with modifications and in the spirit and scope of the appended claims.

What is claimed:

1. An electromagnetic shielding structure comprising:
a conductive structure surrounding and accommodating a circuit or a circuit device arranged on a substrate; and
at least one feed through device associated with the conductive structure and providing signals to the circuit or circuit device,
wherein the substrate comprises one of a silicon substrate and a wafer;
the conductive structure comprises a three-dimentional (3) structure including a box comprising a cover, sidewalls, and a bottom arranged within the substrate;
the cover comprises a layer of metal above the substrate;
the bottom comprises a doped region of the substrate;
the sidewalls are partially within the substrate and extend out of and above the substrate; and
the sidewalls comprise a doped portion of the substrate and at least one via.

2. The structure of claim 1, wherein the conductive structure completely surrounds the circuit or circuit device.

3. The structure of claim 1, wherein the conductive structure has one side arranged above the substrate and comprising one of an analog metal, a top level metal, and via.

4. The structure of claim 1, wherein the conductive structure has one side arranged within the substrate and comprises a high doping layer.

5. The structure of claim 1, wherein the conductive structure has one side partially arranged within the substrate and partially arranged above the substrate and comprises via bars.

6. The structure of claim 1, wherein the at least one feed through device is arranged on one of the sidewalls of the conductive structure.

7. The structure of claim 1, wherein the at least one feed through device is arranged on a portion of one of the sidewalls of the conductive structure arranged above a surface of the substrate.

8. The structure of claim 1, wherein the conductive structure comprises the bottom which comprises doped regions in the substrate, the sidewalls comprising doped regions in the substrate, and the cover having the form of an interconnect layer.

9. The structure of claim 1, wherein the conductive structure comprises the bottom which comprises doped regions in the substrate, the sidewalls comprising multi-layer via bar sidewalls, and the cover having the form of an interconnect layer.

10. The structure of claim 1, wherein the at least one feed through device comprises one of a feed through capacitor, a feed through stripline, and a feed through Microstrip line.

11. The structure of claim 1, wherein:
the conductive structure completely surrounds the circuit or circuit device; and
the at least one feed through device comprises one of a feed through capacitor, a feed through stripline, and a feed through Microstrip line.

12. The structure of claim 1, wherein:
the at least one feed through device comprises a feed through capacitor;
the feed through capacitor comprises an outer member and an inner member;
the outer member has one end coupled to one of the sidewalls and another end surrounding the inner member; and
the inner member passes through the outer member and the one of the sidewalls.

13. The structure of claim 1, wherein:
the at least one feed through device comprises a stripline;
the feed through stripline comprises at least one outer member and an inner member;
the at least one outer member has one end extending out from one side of one of the sidewalls and another end extending out from an opposite side of the one of the sidewalls and into the box;
the at least one outer member surrounds all or part of the inner member;
the inner member passes within and through the at least one outer member and through the one of the sidewalls; and
the inner member and the at least one outer member have different line widths.

14. An electromagnetic shielding structure comprising:
an on-chip shielding structure surrounding a circuit or a circuit device arranged on a substrate; and
at least one feed through device arranged on a side of the shielding structure,
wherein the substrate comprises one of a silicon substrate and a wafer;
the shielding structure comprises a three-dimensional (3D) structure including a cover arranged above the substrate, a bottom arranged within the substrate, and sidewalls at least partially formed by vias formed over the substrate;
the cover comprise a layer of metal above the substrate; and another part arranged above or extending out of the substrate, the another part including
the bottom comprises a doped region of the substrate.

15. The structure of claim 9, wherein the shielding structure is one of circular, square, rectangular, polygonal, oval, and triangular in shape.

16. The structure of claim 14, wherein:
the shielding structure completely surrounds the circuit or circuit device; and
the at least one feed through device comprises one of a feed through capacitor, a feed through stripline, and a feed through Microstrip line.

17. A method of electromagnetic shielding a circuit or circuit device arranged on or in a silicon substrate, the method comprising:
forming an on-chip shielding structure that:
is at least partially arranged within the substrate; and
surrounds the circuit or circuit device; and
providing at least one feed through device with the shielding structure,
wherein the shielding structure comprises a cover, sidewalls, and a bottom arranged within the substrate;

the cover comprises a three-dimensional (3D) structure including a layer of metal above the substrate;

the bottom comprises a doped region in the substrate;

the sidewalls are partially within the substrate and extend out of and above the substrate; and the sidewalls comprise a doped portion of the substrate and at least one via formed over the substrate and contacting the doped portion of the substrate.

18. The method of claim 17, wherein the forming the shielding structure comprises doping a region of the substrate to form the bottom of the shielding structure.

19. An electromagnetic shielding structure comprising:

an on-chip conductive structure surrounding a circuit device arranged on a silicon substrate; and at least one feed through device associated with the conductive structure and providing signals to the device, the conductive structure comprises a three-dimensional (3D) structure including a box comprising a cover, sidewalls, and a bottom arranged within the substrate;

the bottom comprises a doped region of the silicon substrate;

the sidewalls are partially within the substrate and extend out of and above the silicon substrate;

the sidewalls comprise a doped portion of the silicon substrate and at least one via; and the at least one feed through device comprises one of a feed through capacitor, a feed through stripline, and a feed through Microstrip line.

20. The structure of claim 1, wherein:

the conductive structure in an on-chip shielding structure;

the at least one via of the sidewalls comprises a plurality of vias arranged one on top of another in a plurality of wiring levels over the substrate; and one of the plurality of vias is formed on the doped portion of the substrate.

\* \* \* \* \*